Inventor
CARL P. SANDBANK
By Percy P. Lantzy
Attorney

| | |
|---|---|
| a | ·003" |
| b | ·010" |
| c | ·003" |
| d | ·015" |
| e | ·021" |

Inventor
CARL P. SANDBANK
By Percy P. Lantzy
Attorney 3,453,502
MICROWAVE GENERATORS Carl Peter Sandbank, Bishop's Stortford, England, assignor to International Standard Electric Corporation, New York, N.Y., a corporation of Delaware Filed Oct. 11, 1966, Ser. No. 585,900
Claims priority, application Great Britain, Oct. 27, 1965, 45,458/65
Int. Cl. H01l 5/00
U.S. Cl. 317—234 8 Claims

ABSTRACT OF THE DISCLOSURE

This is a semiconductor device consisting of a material which exhibits high field instability effects (Gunn effects) when a potential which exceeds a critical value is applied across the device. A plurality of regions of increased resistivity are formed normal to the length of the device which causes high frequency oscillations to be induced in the device at a lower voltage value. These higher resistive regions can be formed by etching or abrading a groove in the surface of the body or by diffusing a dopant into the surface to accomplish the same purpose. The number of regions thus formed, determine the harmonic frequency of oscillation generated by the device.

The invention relates to semiconductor devices including semiconductive material exhibiting moving high field instability effects, and to apparatus embodying such devices.

If a crystal of one of a certain class of semiconductive materials is subjected to an electric field exceeding a critical value, the resultant current flowing through the crystal contains an oscillatory component of frequency determined by the transit time between the crystal contact areas of a resultant space charge distribution. This phenomenon occurs at ordinary temperatures, does not require an applied magnetic field and does not appear to involve a special crystal doping or geometry; it was first reported by J. B. Gunn (Solid State Communications, volume 1, page 88, 1963) and is therefore known as the Gunn effect. The Gunn effect is believed to arise from the "heating" by the electric field of electrons normally in a low effective mass, high mobility energy level sub-band—resulting in consequent transfer of said electrons into a higher effective mass, lower mobility sub-band. This process gives rise to a current vs. applied field characteristic exhibiting a region of negative differential conductivity. For an applied bias within the negative conductance range of said characteristic a high field region moves from cathode to anode during one cycle of current oscillation. The frequency of oscillation is determined primarily by the length of the current path through the crystal.

The Gunn phenomenon has been detected in Group III–V semiconductor compounds such as gallium arsenide, indium phosphide and cadmium telluride having n-type conductivity.

The term "semiconductive material exhibiting high field instability effects" is used herein to include at least any material (i) exhibiting the Gunn effect as above defined, or (ii) exhibiting similar functional phenomena which may be based on somewhat different internal mechanisms.

The value of the applied field below which spontaneous self-oscillation of the type previously described does not occur may be termed the Gunn threshold value.

An object of this invention is to provide an improved semiconductor device of the type exhibiting high field instability effects.

Another object of the invention is to provide such a device which is capable of generating harmonics of the fundamental operating frequency thereof.

According to a feature of the invention, there is provided a semiconductor device comprising a body of semiconductive material exhibiting high field instability effects and means for applying between spaced contact areas on said body a potential difference producing within said body a steady electric field, the value of said electric field being caused to exceed the Gunn threshold value in selected portions of said body by modulating the conductivity of said body at said portions, the current passed through said body by the external source of potential difference undergoing a single excursion from its steady-state value on encountering the first of said conductivity-modulated portions, the moving high field region, as it propagates along said body, on encountering other conductivity-modulated portions causing said current to undergo further excursions from its steady-state value at each of said other portions to provide a series of output current pulses.

In order to obtain the form of single pulse operation defined in the preceding paragraph, the steady state value of the applied field must exceed a given critical value, determined by experiment for a given material and typically between 50% and 75% of the Gunn threshold value. The steady-state field may be continuously applied or may be pulsed to reduce the total power dissipated in the device.

The body of semiconductive material preferably comprises n-type gallium arsenide or indium phosphide; other Group III–V semiconductor compounds may be employed.

Since the operation of the arrangement is somewhat independent of the pulse repetition frequency, provided this is substantially lower than the Gunn effect self-oscillatory frequency, the arrangement is capable of handling signals of variable frequency such as wide band frequency modulated signals, the upper frequency limit in typical devices being of the order of 1 gHz.

The invention will be best understood by reference to the following detailed description and the accompanying drawings, in which.

Figure 1:
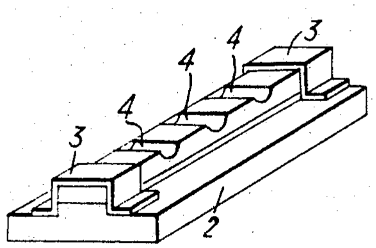
FIGURE 1 shows a microwave generator embodying the principles of the invention.

Referring to FIGURE 1, a layer 1 of semiconductor material such as gallium arsenide having the necessary electrical properties, is deposited on a suitable semi-insulating substrate 2. The substrate 2 may, for example, comprise gallium arsenide upon which the gallium arsenide layer 1 is epitaxially grown. By using a suitable mask, a part of the layer 1 is removed until a strip thereof remains on the substrate as shown in the drawing. Alternatively, a solid piece of semiconductor material could be used in place of the epitaxially deposited layer 1 and the substrate 2. The contact areas 3 which may comprise tin, for example, are formed on the surface of the layers 1 and 2, after appropriate masking, by vacuum evaporation, to leave the desired amount of epitaxial layer 1 exposed between said contacts. The device is then heat treated in a reducing atmosphere which may contain a suitable fluxing agent, to alloy the metal-semiconductor joints between the contacts 3 and the active layer 1 and form an ohmic junction therebetween. The stripes or grooves 4 are etched or air abraded into the layer 1 to form sections of varying transverse conductivity along the length of the layer 1.

A uni-directional voltage source is used to apply a potential difference of controllable value between the contact areas 3, and an output circuit (not shown in the drawing) is used to extract any oscillatory component of the current flowing in the layer 1.

The phenomenon known as the Gunn effect manifests itself by the appearance in the output circuit of an oscillatory component in the current through the layer 1 when the potential difference applied across said layer is caused to exceed a predetermined threshold value.

In the arrangement shown in FIGURE 1 the potential applied between the contact areas 3 is chosen such that when the electric field due to the applied potential encounters the reduced conductivity portion of the layer 1 adjacent the first of the grooves 4, a moving high field instability region is produced due to the increased potential gradient in said reduced conductivity portion, which raises the electric field above the Gunn threshold value. The output circuit current undergoes a single excursion from its steady-state value corresponding to formation of this high field instability region.

This high field instability region, which manifests itself in the output circuit in the form of a current pulse, then propagates along the layer 1. On encountering each of the remaining grooves 4, the output circuit current is again caused to undergo a single excursion from its normal steady state value. Because of the variation in the cross-sectional area of the device, the magnitude of this series of pulses is less than the pulse due to the first high field instability region because of the increased resistance which is presented to the electric field, but there exists a minimum value to which the magnitude of these pulses will fall, this value depending upon the particular material employed. When the original current pulse due to the first high field instability region has propagated the full length of the device between the contact areas 3, the material will momentarily return to its stable state before the sequence is repeated. This is therefore a continuous process, and the device produces a continuous train of output pulses provided the required potential difference is maintained. The frequency of the intermediate pulses is a function of the number of grooves 4. The resulting waveform produced by this device is shown in the drawing according to FIGURE 2.

Figure 3:
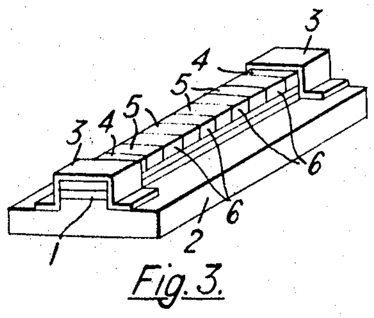
FIGURE 3 shows a microwave generator according to an alternative embodiment of the invention.

Referring to FIGURE 3, a microwave generator is shown representing an alternative form of the arrangement shown in the drawing according to FIGURE 1. The construction of this device is exactly as detailed for the device according to FIGURE 1, except that the conductivity of the material is modulated by doping the epitaxially grown layer 1 with a suitable dopant to produce regions of varying conductivity. The doping process is carried out before the contact areas 3 are vacuum evaporated onto the layer 1 and substrate 2, as set forth in the preceding paragraphs.

An $n+$ dopant is diffused into the surface of the layer 1 to form the areas 4 to which the contact areas 3 are attached. The portions 5 are formed by diffusing into the surface of the layer 1 an $n$-type dopant to produce regions of, for example, resistivity of 2 ohms per centimeter; the portions 6 are also formed by diffusing an $n$-type dopant into the surface of the layer 1 to given regions of, for example, resistivity of 1 ohm per centimeter.

Figure 2:
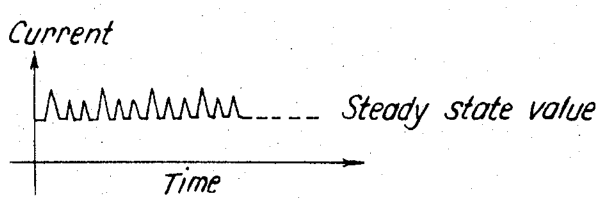
FIGURE 2 shows a typical waveform produced by the device shown in the drawing according to FIG. 1.

The operation of this device is similar to that detailed for the microwave generator shown in the drawing according to FIGURE 1 and the resulting waveform produced is as shown in the drawing according to FIGURE 2.

Figure 4:
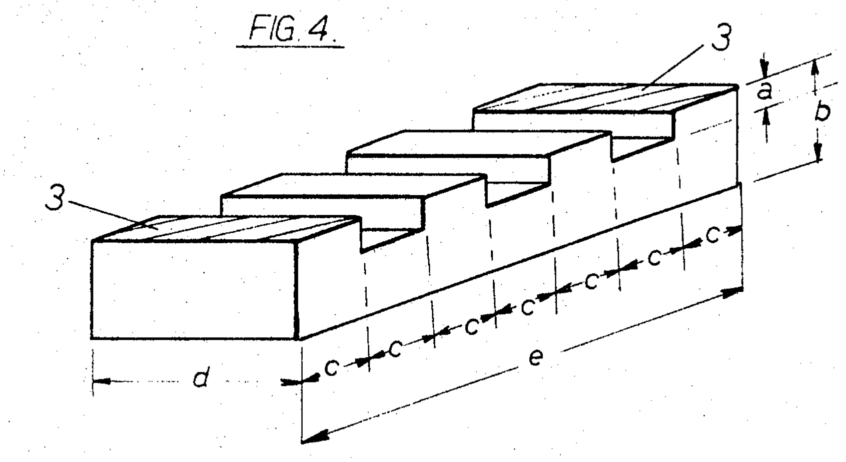
FIGURE 4 shows a microwave generator according to a preferred embodiment of the invention.

A typical device is illustrated in FIG. 4 but it should be noted that the dimensions given for this device are subject to very wide variations depending on the particular application.

In the device shown in FIG. 4, the high field instability region travels at approximately 8 x $10^6$ cms./second; therefore the inherent transit time frequency for this device is 150 mc./s. However, due to the three constrictions in the device cross section there is a strong periodic component of current at 450 mc./s. The overall sample length and the dimensions and number of constrictions can be changed to suit any particular requirement, for example, by varying the area of the strip or by altering the doping. Typically, a potential difference on the order of 187 volts may be applied between the contacts 3.

Photographs of typical samples have been tested, and their output traces look like the waveform illustrated in FIGURE 2.

The arrangements described provide separation of the device terminals without frequency limitation due to transit time.

While the principles of the above invention have been described in connection with specific embodiments and particular modifications thereof, it is to be clearly understood that this description is made by way of example and not as a limitation of the scope of the invention.

What is claimed is:

1. A semiconductive circuit arrangement comprising:
a body of semiconductive material exhibiting high field instability effects;
means for applying between spaced contact areas on said body a potential difference for producing an electric field within said body;
a number of regions formed in selected portions of said body, each successive region being spaced a fixed distance apart and having the resistance of its conducting cross-sectional area increased with respect to the resistance of the conducting cross-sectional area of unselected portions of said body; and
means to nucleate a traveling field domain in said body when said electric field exceeds a given threshold value, and during propagation of said high field domain an output current is modulated on encountering each of the selected portions, thereby providing a series of output pulses during a single excursion from the steady state, the frequency of the pulses being a function of the arrangement of said selected portions along the length of said body.

2. A device according to claim 1, wherein said applied potential difference is unidirectional.

3. A device according to claim 1, wherein the resistance of the conducting cross-sectional area of said selected portions of said body is increased by decreasing the cross-sectional area of said body at said selected portions.

4. A device according to claim 1, wherein the resistance of the conducting cross-sectional area of said unselected portions of said body is decreased by selectively defusing a dopant impurity into said unselected portions.

5. A device according to claim 1, wherein said applied potential difference is such that said electric field is less than said threshold value in said unselected portions.

6. A device according to claim 5, wherein said applied potential difference is such that said applied field is on the order of 50% to 75% of said threshold value in said unselected portions.

7. A device according to claim 1, wherein said contact areas form an ohmic connection to said body.

8. A device according to claim 7, wherein said contact areas comprise tin and said semiconductive material comprises gallium arsenide.

References Cited

UNITED STATES PATENTS 3,365,583 1/1968 Gunn.

JOHN W. HUCKERT, *Primary Examiner.*

J. D. CRAIG, *Assistant Examiner.*

U.S. Cl. X.R.

307—317; 331—107